US008903672B2

(12) United States Patent
Gregg et al.

(10) Patent No.: US 8,903,672 B2
(45) Date of Patent: Dec. 2, 2014

(54) METHODS FOR CALIBRATION OF RADIO-FREQUENCY PATH LOSS IN RADIO-FREQUENCY TEST EQUIPMENT

(75) Inventors: Justin Gregg, San Francisco, CA (US); Tomoki Takeya, Santa Clara, CA (US); Adil Syed, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 755 days.

(21) Appl. No.: 13/011,695

(22) Filed: Jan. 21, 2011

(65) Prior Publication Data

US 2011/0301905 A1    Dec. 8, 2011

Related U.S. Application Data

(60) Provisional application No. 61/351,821, filed on Jun. 4, 2010.

(51) Int. Cl.

| | |
|---|---|
| *G06F 3/02* | (2006.01) |
| *G06F 3/00* | (2006.01) |
| *G06F 3/01* | (2006.01) |
| *G06F 13/00* | (2006.01) |
| *G01R 35/00* | (2006.01) |
| *H04B 17/00* | (2006.01) |
| *H04W 24/00* | (2009.01) |
| *G01R 31/28* | (2006.01) |
| *G01R 27/28* | (2006.01) |
| *H04W 24/06* | (2009.01) |
| *H04W 24/10* | (2009.01) |
| *H04W 28/04* | (2009.01) |

(52) U.S. Cl.
CPC .......... *G01R 35/005* (2013.01); *G01R 31/2837* (2013.01); *G01R 27/28* (2013.01); *H04B 17/0085* (2013.01); *H04W 24/06* (2013.01); *H04W 24/00* (2013.01); *G01R 31/2822* (2013.01); *H04W 24/10* (2013.01); *H04B 17/0012* (2013.01); *H04B 17/0057* (2013.01); *H04W 28/04* (2013.01)

USPC ........... 702/106; 702/104; 702/105; 702/118

(58) Field of Classification Search
USPC ............... 702/82, 85, 86, 104, 106, 182, 183; 370/249; 455/9
See application file for complete search history.

(56) References Cited

U.S. PATENT DOCUMENTS 5,521,904 A * 5/1996 Eriksson et al. .............. 370/249
5,652,712 A * 7/1997 Szczebak et al. ............... 702/85
(Continued)

OTHER PUBLICATIONS

Venkataraman et al., U.S. Appl. No. 12/732,108, filed Mar. 25, 2010.
(Continued)

*Primary Examiner* — Eliseo Ramos Feliciano
*Assistant Examiner* — Felix Suarez
(74) *Attorney, Agent, or Firm* — Treyz Law Group; Jason Tsai; Michael H. Lyons

(57) ABSTRACT

Calibration equipment for calibrating multiple test stations in a test system is provided. Each test station may include a test unit, a test fixture, and a radio-frequency (RF) cable that connects the test unit to the test fixture. A control test setup may be used to calibrate uplink and downlink characteristics associated with each test station (e.g., to determine path loss associated with the RF cable and test fixture and variations associated with the test unit). The control test setup may calibrate each test station at desired frequencies to generate a test station error (offset) table. The test unit of each test station may be individually configured based on the test station error table so that offset is minimized among the different stations and so that the test stations may reliably measure hundreds or thousands of wireless electronic devices during product testing.

21 Claims, 6 Drawing Sheets

(56) References Cited

U.S. PATENT DOCUMENTS

| | | | |
|---|---|---|---|
| 5,722,077 A * | 2/1998 | Kanai | 455/452.1 |
| 6,253,060 B1 * | 6/2001 | Komara et al. | 455/9 |
| 6,259,912 B1 | 7/2001 | Si | |
| 6,360,180 B1 * | 3/2002 | Breger | 702/108 |
| 7,203,472 B2 * | 4/2007 | Seppinen et al. | 455/226.1 |
| 7,489,905 B2 * | 2/2009 | Qi et al. | 455/67.11 |
| 7,555,294 B2 * | 6/2009 | Qi et al. | 455/425 |
| 7,610,529 B2 * | 10/2009 | Yang | 714/724 |
| 8,116,703 B2 * | 2/2012 | Sorensen | 455/115.1 |
| 8,527,229 B2 * | 9/2013 | Chang et al. | 702/104 |
| 8,600,309 B2 * | 12/2013 | Chang et al. | 455/67.11 |
| 2004/0220762 A1 | 11/2004 | Oeflein et al. | |
| 2006/0242504 A1 * | 10/2006 | Kadota | 714/725 |

OTHER PUBLICATIONS

Gregg et al., U.S. Appl. No. 12/769,602, filed Apr. 28, 2010.
Gregg et al., U.S. Appl. No. 61/351,792, filed Jun. 4, 2010.

* cited by examiner

METHODS FOR CALIBRATION OF RADIO-FREQUENCY PATH LOSS IN RADIO-FREQUENCY TEST EQUIPMENT

This application claims the benefit of provisional patent application No. 61/351,821, filed Jun. 4, 2010, which is hereby incorporated by reference herein in its entirety.

BACKGROUND

This relates generally to testing wireless electronic devices, and more particularly, to calibrating test equipment that is used to test wireless electronic devices.

Wireless electronic devices typically include transceiver circuitry, antenna circuitry, and other radio-frequency circuitry that provides wireless communications capabilities. During testing, wireless electronic devices under test (DUTs) can each exhibit different performance levels. For example, each wireless DUT can exhibit its own output power level, gain, frequency response, efficiency, linearity, dynamic range, etc.

The performance of a wireless DUT can be measured using a test instrument. A wireless DUT is typically connected to a test instrument using a radio-frequency cable. There is a path loss associated with a given radio-frequency cable. This path loss is defined as the power attenuation of an electromagnetic signal as it propagates through the radio-frequency cable.

Multiple test stations may be used to test multiple wireless DUTs in parallel, where each test station includes its own test instrument, radio-frequency cable, and test fixture connected in series. A DUT is connected to the test fixture of each test station during test operations. The radio-frequency path of each test station has its own unique path loss characteristic.

In an effort to take into account the radio-frequency cable path loss, a vector network analyzer (VNA) can be connected to each cable to determine its path loss. However, calibrating path loss using this approach requires a VNA and ignores path loss associated with the test fixtures and potential variations that may exist among the different test instruments in the different test stations. Failing to account for test fixture path loss and variations in the behavior of the different test instruments may result in inconsistent measurement data. For example, performance parameters measured using one test station may be offset with respect to the performance parameters measured using another test station.

It would therefore be desirable to be able to provide improved calibration techniques for calibrating wireless test equipment.

SUMMARY

Wireless electronic devices may be tested in a test system. Wireless electronic devices that are tested may be referred to as devices under test (DUTs).

A test system may include multiple test stations. Each test station may include a test unit, a test fixture, and a radio-frequency (RF) cable that connects the test fixture to the test unit. Because the path loss associated with the RF cable and test fixture and the variations associated with the test unit may vary from station to station, each test station may be calibrated using a control test setup (control test setup apparatus). Calibrating each test station using the control test setup aims to minimize the amount of offset (error) that may exist from one station to the next. Minimizing offset in this way may allow each test station in the test system to measure consistent and comparable data from numerous DUTs during product testing.

Uplink and downlink calibration processes may be performed using the control test setup. During uplink calibration, the control test setup may include a calibration plate connected to a signal generator. A power meter may be used to calibrate the calibration plate and the signal generator to determine a known output power level at an output of the calibration plate.

The output of the calibration plate may be connected to the test fixture of a given test station. The signal generator may output RF signals at desired frequencies, and the test unit may measure the output power levels of the RF signals. Uplink test station error values may be calculated based on the measured output power levels and the known output power level at each frequency. The uplink characteristics of multiple test stations may be calibrated using this approach.

During downlink calibration, the control test setup may include a calibration plate connected to a power meter. A signal generator may be used to calibrate the calibration plate and the power meter to determine path loss that is associated with the control test setup.

The calibration plate may be connected to the test fixture of a given test station. The test unit of the given test station may output RF signals at a requested output power level at desired frequencies, and the power meter may measure the output power of the RF signals received by the control test setup. Downlink test station error values may be calculated based on the requested output power level, the measured output power level, and the path loss of the control test setup at each frequency. The downlink characteristics of multiple test stations may be calibrated using this approach.

Uplink and downlink test station error values may be tabulated in a test station error table. The test station error table may include test station error (offset) values for each test station at the desired frequencies for both uplink and downlink operations.

Each test station may be connected to computing equipment. The computing equipment may include a database that is loaded with the test station error table. The computing equipment may automatically configure each test station with respective offset values so that the test stations in the test system exhibit minimal offset from one another. If desired, the offset values may be manually supplied by a user during product testing.

Further features of the present invention, its nature and various advantages will be more apparent from the accompanying drawings and the following detailed description.

DETAILED DESCRIPTION

Wireless electronic devices include antenna and transceiver circuitry that supports wireless communications. Examples of wireless electronic devices include desktop computers, computer monitors, computer monitors containing embedded computers, wireless computer cards, wireless adapters, televisions, set-top boxes, gaming consoles, routers, or other electronic equipment. Examples of portable wireless electronic devices include laptop computers, tablet computers, handheld computers, cellular telephones, media players, and small devices such as wrist-watch devices, pendant devices, headphone and earpiece devices, and other miniature devices.

Wireless electronic devices may communicate with wireless equipment such as cellular telephone base stations, local area network equipment (e.g., IEEE 802.11 equipment), and other wireless network equipment. In uplink test station environments, the wireless electronic devices are sometimes referred to as devices under test (DUTs).

Figure 1:
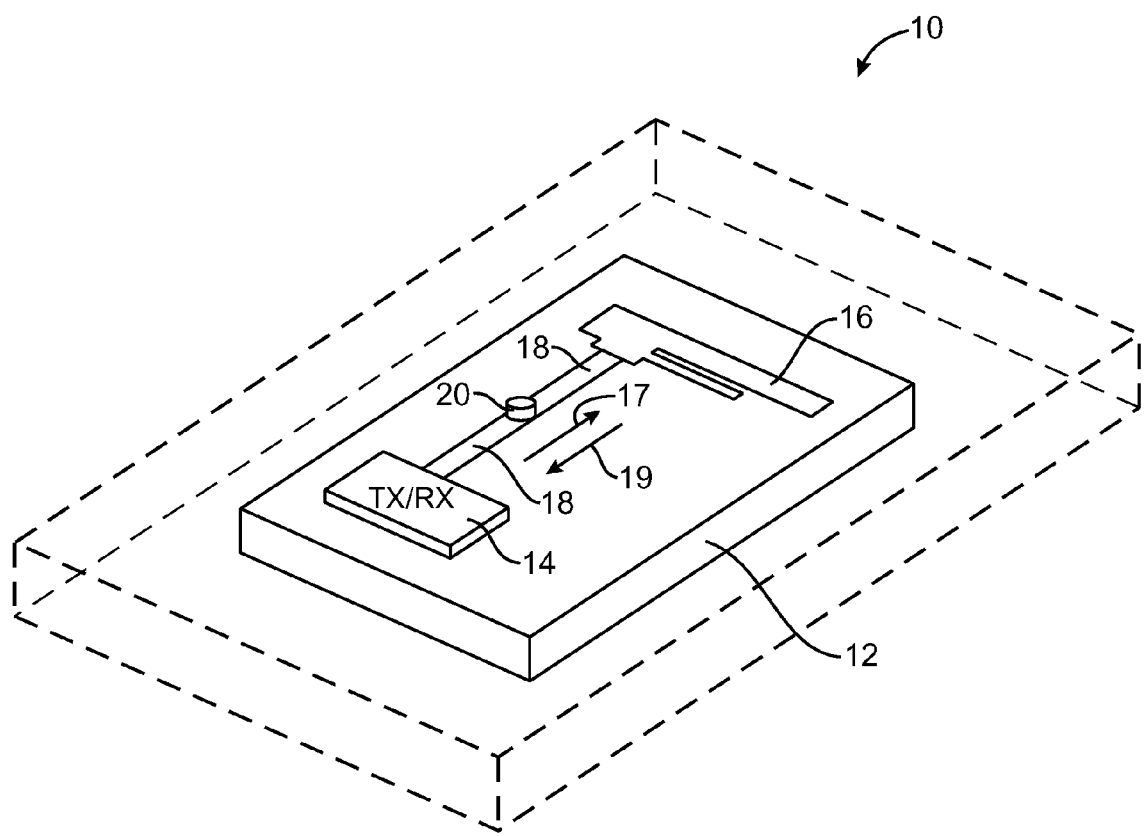
FIG. 1 is a perspective view of an illustrative device under test (DUT) with a radio-frequency DUT connector in accordance with an embodiment of the present invention.

FIG. 1 shows an illustrative device under test (DUT). As shown in FIG. 1, DUT 10 may include transceiver circuitry such as transceiver circuitry 14 mounted on a substrate such as substrate 12. Substrate 12 may, for example, be a printed circuit board (PCB). An antenna such as antenna 16 may be formed on substrate 12.

Antenna 16 may be fabricated by patterning a metal layer on a circuit board substrate or may be formed from a sheet of thin metal using a foil stamping process. Antennas such as planar inverted-F antennas (PIFAs) and antennas based on L-shaped resonating elements can be fabricated in this way. Antenna 16 may also be a PIFA antenna, an L-shaped resonating antenna, or other suitable type of antenna. If desired, more than one antenna 16 may be formed on substrate 12.

A conductive path such as path 18 may be formed on substrate 12 to connect transceiver circuitry 14 to antenna resonating element 16. Path 18 may sometimes be referred to as a transmission line. Transceiver circuitry 14 may send signals through path 18 (in the direction of arrow 17) to antenna 16 for wireless transmission. Antenna 16 may receive wireless signals and send the received signals through trace 18 (in the direction of arrow 19) to transceiver circuitry 14. DUT 10 may be operated to simultaneously transmit and receive wireless signals, if desired.

DUT 10 may include a radio-frequency (RF) connector such as RF DUT connector 20 mounted on top of transmission line 18 (see, e.g., FIG. 1). During normal operation, connector 20 is not connected to another mating connector. When connector 20 is in its unmated state, trace 18 will remain shorted (i.e., trace 18 will connect transceiver circuitry 14 to antenna 16).

During test operations, connector 20 may mate with a corresponding mating connector in a test fixture. When connector 20 is in its mated state, trace 18 will be open-circuited (i.e., trace 18 no longer connects transceiver circuitry 14 to antenna 16). Instead, transceiver circuitry 14 may send signals through a portion of trace 18 and through the mating connector to an external source and may receive signals that are conveyed through the mating connector from the external source. Generally, during test operations, antenna 16 is non-operational and does not receive nor transmit wireless signals.

Figure 2:
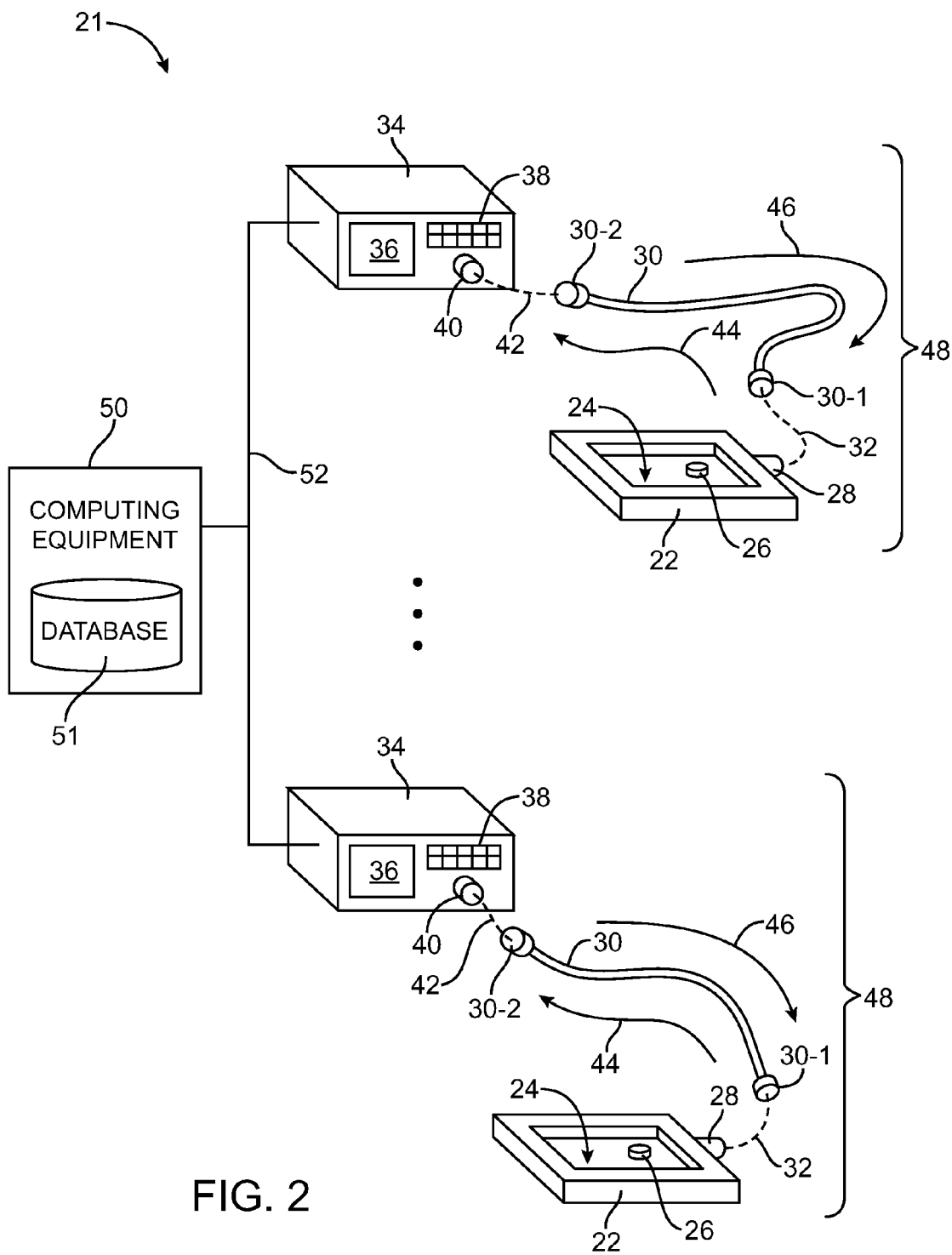
FIG. 2 is a diagram of illustrative test stations each connected to computing equipment and each including a test unit, a radio-frequency cable, and a test fixture in accordance with an embodiment of the present invention.

During product testing, many wireless devices (e.g., hundreds, thousands or more of DUTs 10) may be tested in a test system such as test system 21, as shown in FIG. 2. Test system 21 may include multiple test stations such as test stations 48. Each test station 48 may include a test fixture 22, a radio-frequency (RF) cable 30, and a test unit 34.

Test fixture 22 may have features for engaging DUTs. For example, test fixture 22 may have a region such as recessed portion (slot) 24 in which a DUT 10 may be placed during testing. Text fixture 22 may have a connector 26 that is located in region 24 and a connector 28 that is attached outside region 24 (see, e.g., FIG. 2). During testing, a DUT 10 may be inserted into region 24 so that connector 20 of DUT 10 mates with corresponding connector 26 of test fixture 22.

Test unit (tester) 34 in each test station 28 may be a radio communications tester of the type that is sometimes referred to as a test box or a universal radio communications tester. Test unit 34 may, for example, be the CMU200 Universal Radio Communication Tester available from Rohde & Schwarz. Testers of this type may perform radio-frequency signaling tests for a variety of different radio-frequency communications bands and channels. If desired, any type of radio-frequency tester may be used in each test station 48.

Test unit 34 may be operated directly or via computer control. When operated directly, a user may control a test unit 34 by supplying commands directly to the test unit using the user input interface of the test unit. For example, a user may press buttons in a control panel 38 on the test unit while viewing information that is displayed on a display 36 in the test unit. In computer controlled configurations, computing equipment such as computer 50 (e.g., software running autonomously or semi-autonomously on the computer) may communicate with the test unit (e.g., by sending and receiving data over a wired path 52 or a wireless path between the computer and the test unit).

Test unit 34 may have a test unit connector such as test unit connector 40 through which test signals may be conveyed, as shown in FIG. 2. Test unit 34 may be connected to test fixture 22 through radio-frequency (RF) cable 30. RF cable 30 may include first and second ports that have first and second connectors 30-1 and 30-2, respectively. First connector 30-1 of RF cable 30 may be connected to connector 28 of test fixture 22 (as shown by dotted line 32) whereas second connector 30-2 of RF cable 30 may be connected to connector 40 of test unit 34 (as shown by dotted line 42).

Test station 48 with test unit 34 connected to test fixture 22 using RF cable 30 in this way may be used to test a wireless electronic device. For example, a DUT 10 may be attached to test fixture 22 during testing so that DUT connector 20 is connected to connector 26 of test fixture 22. When connected using this arrangement, wireless signals may be conveyed between transceiver circuitry 14 of DUT 10 and test unit 34 through RF cable 30.

Test unit 34 may be used to characterize the uplink and downlink behavior of DUT 10. During uplink characterization, DUT 10 may send wireless signals through RF cable 30 in the direction of arrow 44, and test unit 34 may be used to measure an output power level, frequency response, gain, linearity, efficiency, and other performance parameters of DUT 10 at desired frequencies.

During downlink characterization, test unit 34 may be used to send wireless signals through RF cable 30 in the direction of arrow 46. Measurements such as a received power level may then be taken at the DUT 10 (as an example). Test stations 48 may therefore be referred to as bidirectional, because test stations 48 can be used to measure both uplink and downlink characteristics.

Each test station 48 should be calibrated prior to testing to ensure that measurements taken across the different test stations are consistent with one another. Sources of error (offset) that may exist from one test station to another include path loss associated with each RF cable 30 and test fixture 22 and variations in each test unit 34 (e.g., process, voltage, and temperature (PVT) variations that may affect the operation of each tester).

Path loss can be defined as the attenuation in power density as wireless signals propagate through a particular medium. The path loss associated with cable 30 and test fixture 22 in each test station 48 may be unique, because it is challenging to manufacture test equipment (e.g., RF cables 30, test fixtures 22, etc.) that are exactly identical to one another. As a result, it may be necessary to take into account of what path loss is associated with each cable 30 and fixture 22 when calibrating test stations 48.

Similarly, manufacturing identical test units 34 may be equally if not even more challenging. In addition to process variations (e.g., the testers include silicon parts that may suffer from random device parameter variations created during non-ideal semiconductor fabrication steps), operational variations such as voltage and temperature variations may also cause each test unit 34 to behave differently during actual testing conditions.

Calibration techniques that take into account the path loss of RF cables 30 and test fixtures 22 and the PVT variations in test units 34 and that aim to minimize offset that exist among the different test stations may therefore be desirable.

To calibrate the different test stations 48 in test system 21, a control test setup apparatus (calibration equipment) may be used to calibrate each test station 48 and to determine the amount of offset (test station error) that is associated with each test station 48.

For example, consider a scenario in which a control test setup is used to characterize test station errors during uplink operations. The control test setup may, as an example, output a precise known output power level of −30 dBm. Power in terms of dBm expresses power relative to 1 mW in units of decibels. The control test setup may be connected to a first test fixture 22 of a first test station 48. A first test unit 34 of first test station 48 may be used to measure the output power level of the wireless signals that are received from the control test setup over RF cable 30. First test unit 34 may measure a received power level of −32 dBm (as an example). The test station error of first test station 48 may therefore have a value of 2 dB (−30 minus −32).

To calibrate another test station, the control test setup may be connected to a second test fixture 22 of a second test station 48. A second test unit 34 of second test station 48 may be used to measure the output power level of the wireless signals that are received from the control test setup over RF cable 30. Second test unit 34 may measure a received power level of −33 dBm (as an example). The test station error of second test station 48 may therefore have a value of 3 dB (−30 minus −33).

The uplink test station error values of each test station 48 may be measured across different operating frequencies using this approach. The downlink test station error values may also be measured using the control test setup. Consider another scenario in which the control test setup includes a power meter that can be used to measure the power of incoming wireless signals during downlink operations. There may be a known fixed 0.4 dB loss associated with the control test setup (as an example).

The control test setup may be connected to a first test fixture 22 of a first test station 48. A first test unit 34 of first test station 48 may be set to transmit wireless signals at requested power level of −30 dBm over RF cable 30 (as an example). The power meter of the control test setup may, for example, measure a received power level of −31.5 dBm. Taking into account the fixed loss associated with the control test setup, the test station error of first test station 48 may therefore have a value of 1.9 dB (−30 minus −31.5 plus 0.4).

To calibrate another test station, the control test setup may be connected to a second test fixture 22 of a second test station 48. A second test unit 34 of second test station 48 may be set to transmit wireless signals at requested power level of −30 dBm over RF cable 30 (as an example). The power meter of the control test setup may, for example, measure a received power level of −32.7 dBm. Taking into account the fixed loss associated with the control test setup, the test station error of first test station 48 may therefore have a value of 3.1 dB (−30 minus −32.7 plus 0.4). Downlink test station error values may be measured at different operating frequencies, if desired.

Measuring uplink and downlink test station error values of each test station 48 at various frequencies in this way using the control test setup may generate test station error (offset) values that take into account the path loss associated with RF cables 30 and test fixtures 22 (and for connections formed with these components) and the variations associated with each test unit 34 during actual testing conditions.

The calculated test station error values may be used to individually calibrate each test station 48 so that there is minimal offset (e.g., difference in path loss and test unit variations) among the different test stations.

The test station error values may be tabulated in a test station error (offset) table. The test station error table may have uplink and downlink test station error values corresponding to different operating frequencies for each test station 48. For example, the test station error table may display an uplink error value of 1 dB and a downlink error value of 1.5 dB for a given test station operating at 800 MHz whereas the test station error table may display an uplink error value of 1.8 dB and a downlink error value of 2.5 dB for the given test station operating at 1800 MHz.

As shown in FIG. 2, each test station 48 may be connected to computing equipment 50 through line 52. Computing equipment 50 may have storage equipment such as database 51. The test station error table may be stored on database 51. Computing equipment 50 may automatically configure test unit 34 of each test station 48 based on the test station error table (e.g., computing equipment 50 may adjust each test unit 34 with a corresponding offset amount depending on its current operating frequency) so that DUT measurements taken across each test station 48 in test system 21 are consistent and comparable. If desired, the error values may be manually input by a user based on the test station error table by controlling an offset control knob in control panel 38 (as an example). In general, any suitable way of configuring test stations 48 to have minimal offset among one another may be used.

Figure 3:
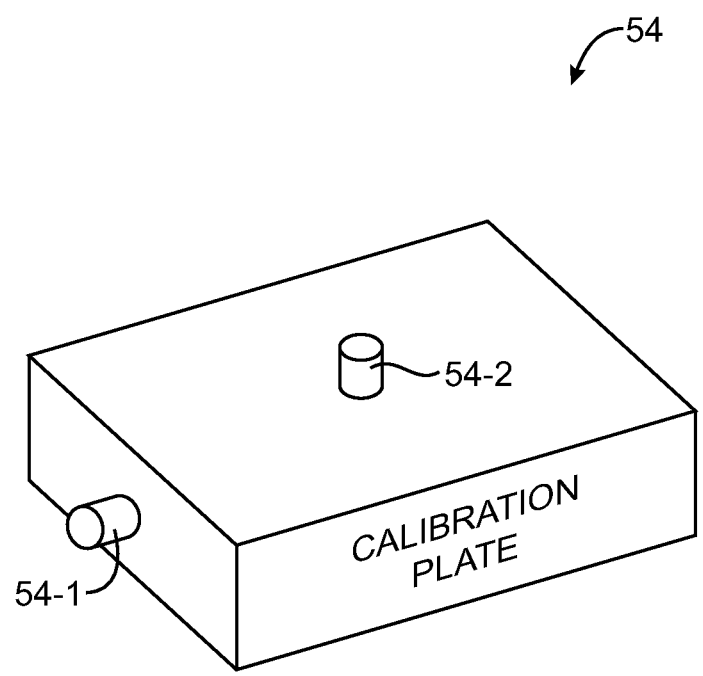
FIG. 3 is a perspective view of an illustrative calibration plate with two radio-frequency connectors in accordance with an embodiment of the present invention.

The control test setup may include a calibration plate such as calibration plate 54, as shown in FIG. 3. Calibration plate 54 may have a first RF connector (a first port) such as connector 54-1 and a second RF connector (a second port) such as connector 54-2. RF ports 54-1 and 54-2 may be shorted through conductive paths within calibration plate 54.

Figure 4:
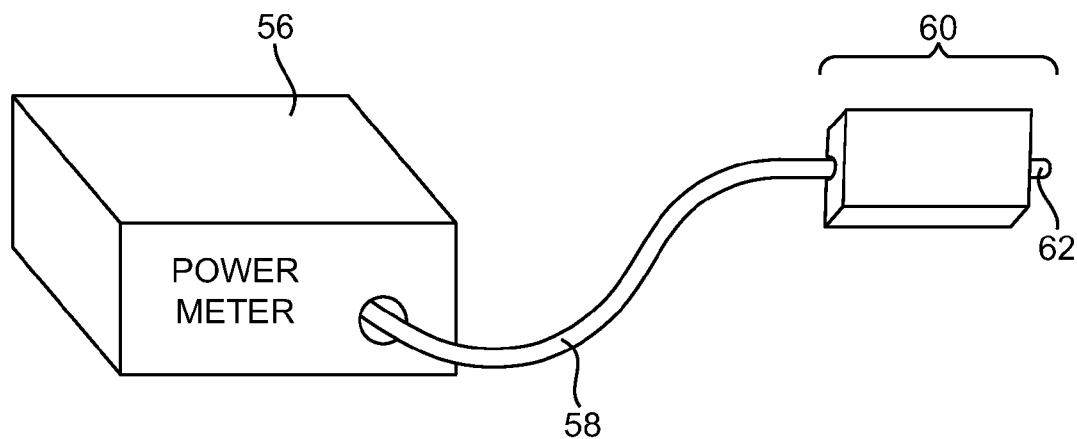
FIG. 4 is a perspective view of an illustrative power meter with a test probe in accordance with an embodiment of the present invention.
Figure 5:
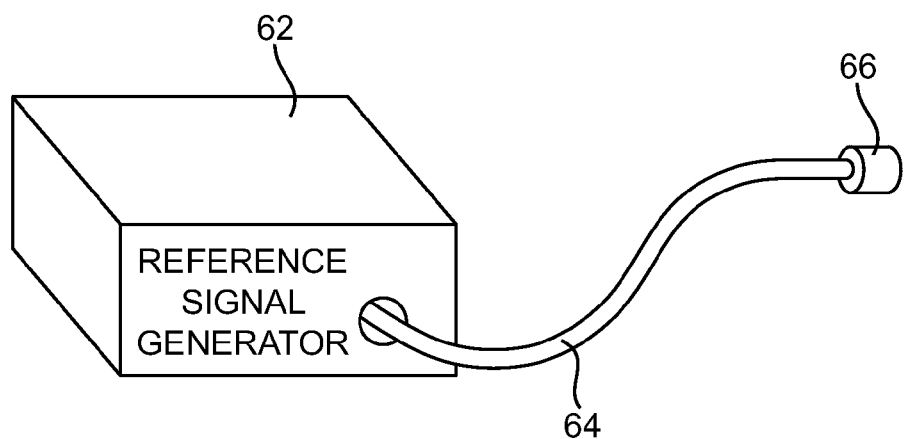
FIG. 5 is a perspective view of an illustrative reference signal generator with a signal generator connector in accordance with an embodiment of the present invention.

Test equipment that may be connected to calibration plate 54 during calibration steps may include an RF power meter such as power meter 56 and an RF reference signal generator such as reference signal generator 62, as shown respectively in FIGS. 4 and 5. Power meter 56 may be used to measure the power level of radio-frequency signals received through test probe 60 and radio-frequency cable 58 (e.g., RF cable 58 connects power meter main unit 56 to test probe 60). Test probe 60 may have an RF connector 62. Connector 62 of test probe 60 may mate with connector 54-1 or 54-2 of calibration plate 54 during calibration processes.

Power meter 56 may, for example, be the NRP Power Meter available from Rohde & Schwarz. Power meters of this type may perform radio-frequency power measurements for signals across different radio-frequency communications bands and channels. For example, this type of tester may be used in performing peak and peak-to-average power measurements for signals from steady state (i.e., direct current (DC) conditions) to 40 GHz. If desired, any type of radio-frequency power meter may be used.

RF reference signal generator 62 may be used to generate radio-frequency signals through cable 64 and connector 66 (e.g., RF cable 64 connects signal generator main unit 62 to connector 66). Connector 66 of signal generator 62 may mate with connector 54-1 or 54-2 of calibration plate 54 during calibration processes.

Reference signal generator 62 may, for example, be the SMU200A available from Rohde & Schwarz. Signal generators of this type may generate multiple radio-frequency signals across different radio-frequency communications bands and channels. For example, this type of tester may be used to generate radio-frequency waveforms with frequencies up to 6 GHz. If desired, any type of radio-frequency signal generator may be used.

Figure 6:
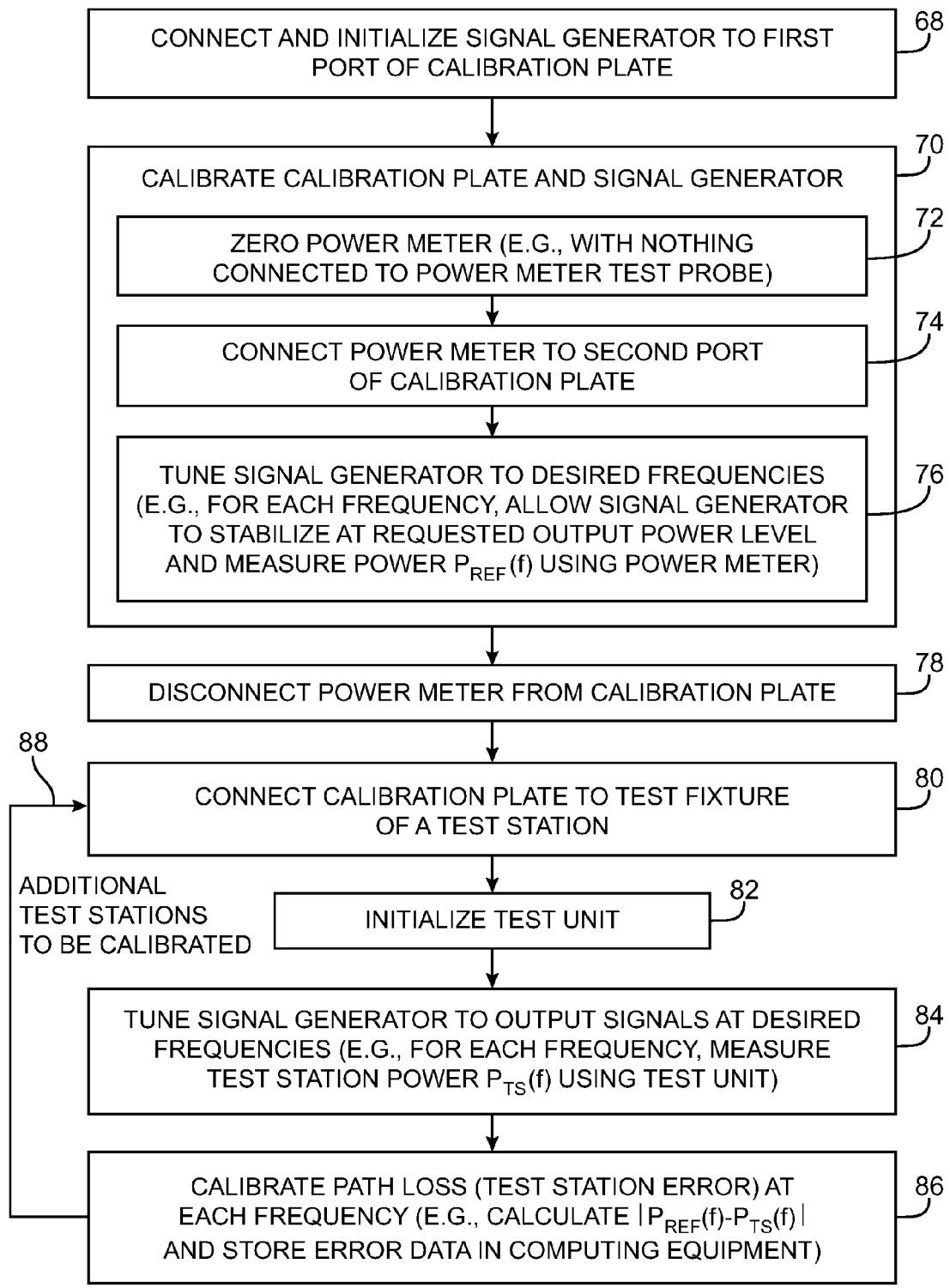
FIG. 6 is a flow chart of illustrative steps involved in calibrating uplink test station characteristics in accordance with an embodiment of the present invention.

FIG. 6 shows steps involved in calibrating the uplink characteristics of test system 21 using the control test setup. At step 68, reference signal generator 62 may be connected to first connector 54-1 of calibration plate 54 (i.e., connector 66 of signal generator 62 is connected to connector 54-1 of calibration plate 54).

At step 70, calibration plate 54 and signal generator 62 may be calibrated using power meter 56. Before connecting power meter 56 to another test equipment (e.g., when nothing is connected to power meter test probe 60), power meter 56 may be zeroed out (step 72). After zeroing power meter 56, power meter 56 may then be connected to second connector 54-2 of calibration plate 54 (i.e., connector 62 of power meter 56 is connected to connector 54-2 of calibration plate 54), as shown in step 74.

Signal generator 62 may then be tuned to generate reference radio-frequency (RF) signals at desired frequencies (step 76). At each frequency, signal generator 62 may be allowed to stabilize at a requested output power level. Thereafter, power meter 56 may be used to measure a reference power level $P_{REF}(f)$ as a function of frequency. Reference power level $P_{REF}(f)$ represents the power level of wireless signals (e.g., reference RF signals generated by signal generator 62) output at port 54-2 of calibration plate 54.

At step 78, power meter 56 may be disconnected from calibration plate 54 (i.e., connector 62 of power meter 56 is disconnected from connector 54-2 of calibration plate 54).

At step 80, calibration plate 54 may be connected to test fixture 22 of a given test station 48 (i.e., connector 54-2 of calibration plate is connected to connector 26 of test fixture 22). Test unit 34 of given test station 48 may be powered on and initialized (step 82).

At step 84, signal generator 62 may be tuned to generate RF signals at the desired frequencies. At each frequency, signal generator 62 will send RF signals through RF cable 30 to test unit 34. Test unit 34 may be used to measure a test station power level $P_{TS}(f)$ as a function of frequency. Test station power level $P_{TS}(f)$ represents the power level of the RF signals that are received at test unit 34.

At step 86, the test station error may be calculated for each frequency. In particular, the test station error may be calculated by subtracting test station power level $P_{TS}(f)$ from reference power level $P_{REF}(f)$ at each frequency (e.g., calculate $|P_{REF}(f)-P_{TS}(f)|$ at each frequency).

For example, given test station 48 may be calibrated at 1900 MHz. Reference power level $P_{REF}(1900 \text{ MHz})$ and test station power level $P_{TS}(1900 \text{ MHz})$ may be −31 dBm and −33 dBm, respectively. The test station error of given test station 48 at 1900 MHz is therefore 2 dB (|−31−(−33)|). Test station error values may be calculated in this way for any desired operating frequencies. Test station error data collected using this approach may be stored in database 51 of computing equipment 50 (e.g., test station error values may be stored in the test station error table that is stored in database 51).

Uplink calibration processes may loop back to step 80 if additional test stations other than the given test station still need to be calibrated, as indicated by path 88. Once all test stations 48 in test system 21 have been calibrated, test unit 34 of each test station 48 may be individually configured based on the test station error table so that uplink offset/error among the different test stations 48 is minimized.

Figure 7:
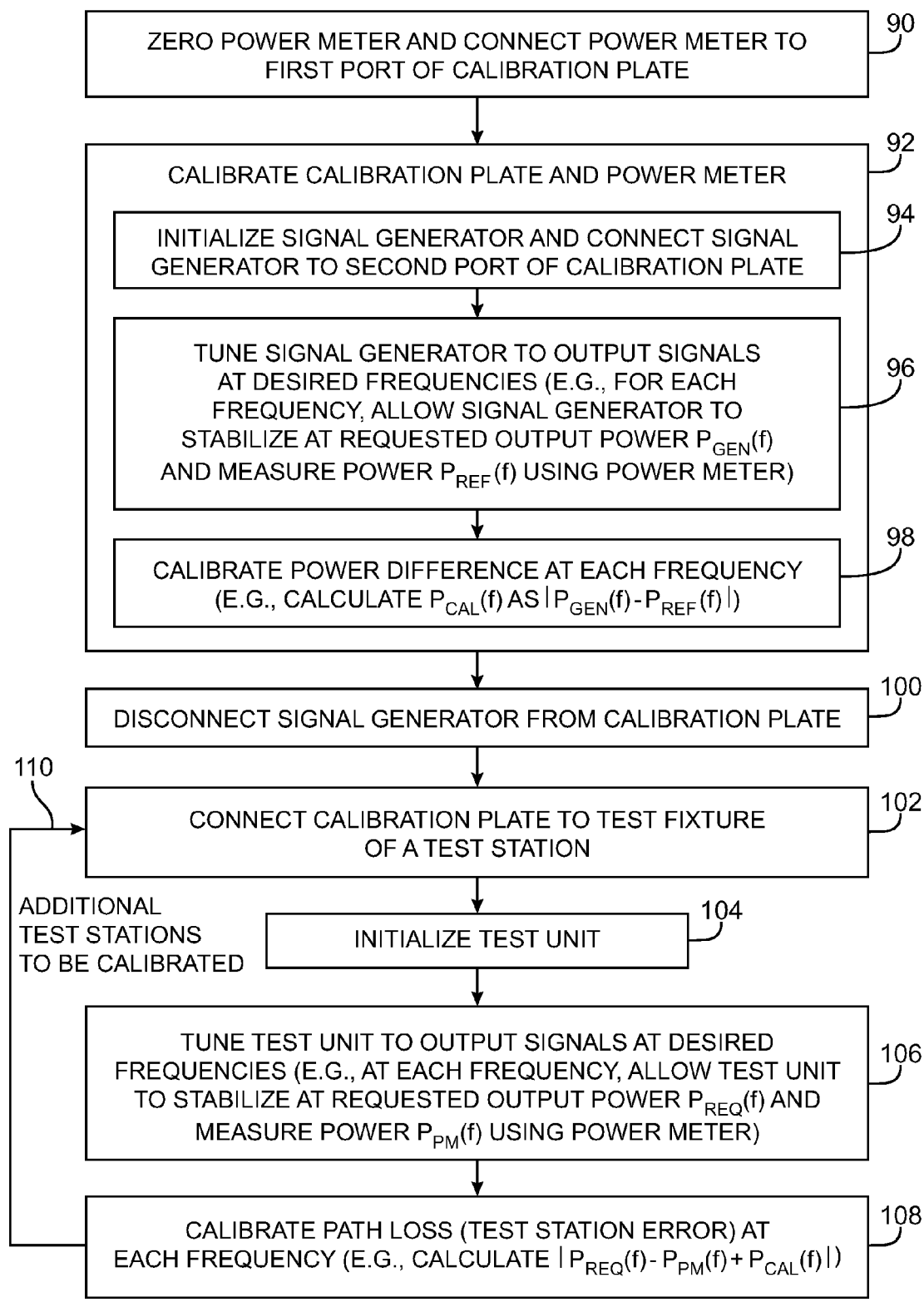
FIG. 7 is a flow chart of illustrative steps involved in calibrating downlink test station characteristics in accordance with an embodiment of the present invention.

FIG. 7 shows steps involved in calibrating the downlink characteristics of test system 21 using the control test setup. At step 90, power meter 56 may be zeroed out and connected to first connector 54-1 of calibration plate (i.e., connector 62 of power meter 56 may be connected to first connector 54-1 of calibration plate 54). In downlink calibration processes, power meter 56 may remain connected to calibration plate 54 and may serve as a control measurement unit against which power measurements may be compared.

At step 92, calibration plate 54 and power meter 56 may be calibrated using signal generator 62 to determine control test setup path loss power levels. Signal generator 62 may first be initialized (step 94). Signal generator 62 may be connected to second connector 54-2 of calibration plate 54 (i.e., connector 66 of signal generator 62 is connected to second connector 54-2 of calibration plate 54).

Signal generator 62 may be tuned to output signal generator RF signals at a signal generator power level $P_{GEN}(f)$ at desired frequencies (step 96). At each frequency, signal generator 62 may be allowed to stabilize at the signal generator power level, and signal generator 62 may send the signal generator RF signals through calibration plate 54 to power meter 56. Power unit 56 may be used to measure a reference (output) power level $P_{REF}(f)$ as a function of frequency.

At step 98, the control test setup path loss associated with calibration plate 54 and power meter cable 58 may be calculated by subtracting reference power $P_{REF}(f)$ from requested output power level $P_{GEN}(f)$ (e.g., by calculating $P_{CAL}(f)$ as $|P_{GEN}(f)-P_{REF}(f)|$ at each frequency). Control test setup path loss power level $P_{CAL}(f)$ may represent the amount of power attenuation experienced by RF signals that travel through calibration plate 54 and power meter cable 64.

At step 100, signal generator 62 may be disconnected from calibration plate 54 (i.e., connector 66 of signal generator 62 may be disconnected from second connector 54-2 of calibration plate 54).

At step 102, calibration plate 54 may be connected to test fixture 22 of a given test station 48 (i.e., connector 54-2 of calibration plate 54 may be connected to connector 26 of test fixture 22). Test unit 34 of given test station 48 may be powered on and initialized (step 104).

At step 106, test unit 34 may be tuned to output signals at a requested (output) power level $P_{REQ}(f)$ at the desired frequencies. At each frequency, test unit 34 is allowed to stabilize at requested power level $P_{REQ}(f)$ and a power meter power level $P_{PM}(f)$ measured using power meter 56 may be recorded. Requested power level $P_{REQ}(f)$ may represent the requested power of the RF signals that is generated by the tester of given test station 48 whereas power meter power level $P_{PM}(f)$ represents the power level of RF signals that is received at power meter 56 through RF cable 30, calibration plate 54, and power meter cable 58.

At step 108, the downlink test station error may be calculated for each frequency. In particular, the downlink test station error may be calculated at each frequency by subtracting power meter power level $P_{PM}(f)$ from requested output power level $P_{REQ}(f)$ and then adding power difference $P_{CAL}(f)$ (e.g., the value $|P_{REQ}(f)-P_{PM}(f)+P_{CAL}(f)|$ may be calculated at each frequency).

Subtracting power meter power level $P_{PM}(f)$ from requested output power level $P_{REQ}(f)$ calculates the path loss and discrepancy between the desired (requested) output power of RF signals and the actual power of RF signals measured using the control test setup (e.g., calibration plate 54 and power meter 56 in the downlink setup). Adding $P_{CAL}(f)$ removes the path loss contribution of the control test setup, because proper calibration should only take into account path loss and variations that are associated with test unit 34 and RF cable 30 but not the path loss associated with the control test setup used for calibration purposes.

For example, given test station 48 may be calibrated at 2.4 GHz. Power level $P_{REQ}(2.4\ GHz)$, $P_{PM}(2.4\ GHz)$, and $P_{CAL}(2.4\ GHz)$ may be −29 dBm, −31.5 dBm, and 0.8 dB, respectively. The test station error of given test station 48 at 2.4 GHz is therefore 3.3 dB (|−29−(−31.5)+0.8|). Test station error values may be calculated in this way for the desired frequencies. Test station error data collected using this approach may be stored in database 51 of computing equipment 50 (e.g., test station error values may be stored in the test station error table that is stored in database 51).

Downlink calibration processes may loop back to step 102 if additional test stations other than the given test station still need to be calibrated, as indicated by path 110. Once all test stations 48 in test system 21 have been calibrated, test unit 34 of each test station 48 may then be individually configured based on the test station error table so that downlink offset/error among the different test stations 48 is minimized. At this point, test stations 48 may be used to test hundreds of thousands of DUTs 10 and reliable (consistent and comparable) data may be collected across the different test stations for product testing purposes.

The foregoing is merely illustrative of the principles of this invention and various modifications can be made by those skilled in the art without departing from the scope and spirit of the invention.

What is claimed is:

1. A method of calibrating a plurality of test stations using a control test setup apparatus, wherein each test station includes a test unit, a test fixture, and a radio-frequency cable that connects the test fixture to the test unit, the method comprising:
   with test equipment, calibrating the control test setup apparatus to obtain a set of reference power levels;
   connecting the control test setup apparatus to the test fixture of a selected one of the test stations;
   with the control test setup apparatus, sending radio-frequency signals at desired frequencies to the test unit of the selected one of the test stations over the radio-frequency cable;
   with the test unit of the selected one of the test stations, measuring a set of test station power levels for the radio-frequency signals at the desired frequencies; and
   with computing equipment, computing uplink test station error values based on the set of reference power levels and the set of test station power levels.

2. The method defined in claim 1, wherein the control test setup apparatus includes a reference signal generator and a calibration plate that has first and second ports, wherein the reference signal generator is connected to the first port of the calibration plate, and wherein calibrating the control test setup apparatus comprises:
   with the reference signal generator, supplying reference radio-frequency signals at the desired frequencies to the first port of the calibration plate; and
   outputting the reference radio-frequency signals at the second port of the calibration plate.

3. The method defined in claim 2, wherein the test equipment comprises a power meter and wherein calibrating the control test setup apparatus further comprises:
   with the power meter, measuring the reference radio-frequency signals at the desired frequencies at the second port of the calibration plate to obtain the set of reference power levels.

4. The method defined in claim 1, wherein computing the uplink test station error values comprises subtracting the set of test station power levels from the set of reference power levels.

5. The method defined in claim 4, wherein each of the test stations is connected to the computing equipment, the method further comprising:
   with the computing equipment, configuring the test unit of each test station using a corresponding one of the uplink test station error values.

6. The method defined in claim 1, further comprising:
   with the computing equipment, computing uplink test station error values at the desired frequencies for each of the plurality of test stations; and
   generating an uplink test station error table based on the uplink test station error values computed from the plurality of test stations at the desired frequencies.

7. The method defined in claim 6, wherein each of the test stations is connected to the computing equipment and wherein the computing equipment includes a database, the method further comprising:
   storing the uplink test station error table on the database in the computing equipment.

8. The method defined in claim 7, further comprising:
   with the computing equipment, configuring the test unit of each test station using a corresponding one of the uplink test station error values in the uplink test station error table.

9. A method of calibrating a plurality of test stations using a control test setup apparatus, wherein each test station includes a test unit, a test fixture, and a radio-frequency cable that connects the test fixture to the test unit, the method comprising:
   with test equipment, calibrating the control test setup apparatus to obtain a set of control test setup path loss power levels;
   connecting the control test setup apparatus to the test fixture of a selected one of the test stations;

with the test unit of the selected one of the test stations, sending radio-frequency signals at desired frequencies and at a requested power level to the control test setup apparatus over the radio-frequency cable;

with the control test setup, measuring a set of power meter power levels for the radio-frequency signals at the desired frequencies; and with computing equipment, computing downlink test station error values based on the set of control test setup path loss power levels, the set of power meter power levels, and the requested power level.

10. The method defined in claim 9, wherein the test equipment comprises a reference signal generator and wherein calibrating the control test setup apparatus further comprises:

with the reference signal generator, generating signal generator radio-frequency signals at the desired frequencies and at a signal generator power level.

11. The method defined in claim 10, wherein the control test setup apparatus includes a power meter and a calibration plate that has first and second ports, wherein the power meter is connected to the first port of the calibration plate, and wherein calibrating the control test setup apparatus further comprises:

receiving the signal generator radio-frequency signals through the first port of the calibration plate;

outputting the signal generator reference radio-frequency signals at the second port of the calibration plate; and with the power meter, measuring the signal generator radio-frequency signals at the second port of the calibration plate to obtain a set of reference power levels at the desired frequencies.

12. The method defined in claim 11, wherein obtaining the set of control test setup path loss power levels comprises subtracting the set of reference power levels from the signal generator power level.

13. The method defined in claim 12, wherein computing the downlink test station error values comprises:

subtracting the set of power meter power levels from the requested power level and adding the set of control test setup power levels to determine the downlink test station error values.

14. The method defined in claim 13, further comprising:

with the computing equipment, computing downlink test station error values for each of the plurality of test stations; and generating a downlink test station error table based on the downlink test station error values computed from the plurality of test station at the desired frequencies.

15. The method defined in claim 14, wherein each of the test stations is connected to the computing equipment and wherein the computing equipment includes a database, the method further comprising:

storing the downlink test station error table on the database in the computing equipment.

16. The method defined in claim 15, further comprising:

with the computing equipment, configuring the test unit of each test station using a corresponding one of the downlink test station error values in the downlink test station error table.

17. A method of calibrating a test station with calibration equipment, wherein the test station includes a test unit, a test fixture, and a radio-frequency connector that connects the test fixture to the test unit, wherein the test fixture has a radio-frequency connector configured to mate with a radio-frequency port in a device under test during testing, and wherein the calibration equipment includes a calibration plate with first and second ports, the method comprising:

with a power meter connected to the second port of the calibration plate, measuring a reference power level of reference radio-frequency signals supplied at the second port of the calibration plate to produce calibrated reference radio-frequency signals; and with the second port connected to the radio-frequency connector of the test fixture, measuring an uplink path loss associated with the test station by applying the calibrated reference radio-frequency signals from the second port of the calibration plate to the radio-frequency connector of the test fixture.

18. The method defined in claim 17, further comprising:

with the power meter connected to the first port of the calibration plate, measuring a calibration plate path loss through the calibration plate.

19. The method defined in claim 18, further comprising:

with the power meter connected to the first port of the calibration plate and the second port of the calibration plate connected to the radio-frequency connector of the test fixture, measuring a downlink path loss associated with the test station by applying test station radio-frequency signals from the radio-frequency connector of the test fixture to the second port of the calibration plate.

20. The method defined in claim 19, wherein the calibration equipment further includes a signal generator and wherein measuring the uplink path loss associated with the test station by applying the calibrated reference radio-frequency signals from the second port of the calibration plate to the radio-frequency connector of the test fixture comprises:

with the signal generator connected to the first port of the calibration plate, supplying radio-frequency signals to the first port of the calibration plate with the signal generator to produce the calibrated reference radio-frequency signals at the second port.

21. The method defined in claim 20, wherein measuring the calibration plate path loss through the calibration plate comprises:

measuring the calibration plate path loss through the calibration plate with the signal generator connected to the second port of the calibration plate.

* * * * *